United States Patent [19]
Kendall et al.

[11] Patent Number: 5,903,496
[45] Date of Patent: May 11, 1999

[54] SYNCHRONOUS PAGE-MODE NON-VOLATILE MEMORY WITH BURST ORDER CIRCUITRY

[75] Inventors: Terry L. Kendall, Diamond Springs; Kenneth G. McKee, Shingle Springs, both of Calif.

[73] Assignee: Intel Corporation, Santa Clara, Calif.

[21] Appl. No.: 08/882,690

[22] Filed: Jun. 25, 1997

[51] Int. Cl.$^6$ .................................................. G11C 16/06
[52] U.S. Cl. ............................. 365/185.12; 365/189.02; 365/233; 365/238.5; 365/189.05
[58] Field of Search ....................... 365/185.12, 189.02, 365/233, 238.5, 189.05

[56] References Cited

U.S. PATENT DOCUMENTS

| | | | |
|---|---|---|---|
| 5,339,276 | 8/1994 | Takasugi | 365/230.02 |
| 5,559,752 | 9/1996 | Stephens, Jr. et al. | 365/233 |
| 5,663,909 | 9/1997 | Sim | 365/185.33 |

OTHER PUBLICATIONS

"Synchronous Dynamic RAM", (Preliminary), Hitachi, Apr. 13, 1994, pp. 1–8.

*Primary Examiner*—David Nelms
*Assistant Examiner*—Andrew Q. Tran
*Attorney, Agent, or Firm*—Blakely, Sokoloff, Taylor & Zafman LLP

[57] ABSTRACT

A method and apparatus for outputting data stored in a non-volatile memory device. The non-volatile memory device includes a non-volatile memory array, an address input for receiving an address indicating a plurality of data values stored in the non-volatile memory array, a sense amplifier circuit to amplify the indicated plurality of data values, a multiplexer to receive the indicated plurality of data values, a clock input for receiving a clock signal and a data selector. The data selector generates a sequence of select signals in response to respective transitions of the clock signal. Each select signal of the sequence of select signals is asserted to the multiplexer to enable the multiplexer to output a respective one of the plurality of data values.

27 Claims, 5 Drawing Sheets

SYNCHRONOUS PAGE-MODE NON-VOLATILE MEMORY WITH BURST ORDER CIRCUITRY

FIELD OF THE INVENTION

The present invention relates to the field of data storage. More particularly, this invention relates to a method and apparatus for retrieving data stored in a non-volatile memory array.

BACKGROUND OF THE INVENTION

The read cycle time for most modern processors is significantly less than the access time of many non-volatile semiconductor memory devices, including erasable programmable read-only-memory (EPROM), electrically erasable programmable read-only memory (EEPROM) and flash EPROM. Consequently, to avoid reading incorrect data after addressing such a memory device, a computer system's processor must be delayed for a number of wait states before being allowed to read the device output. Because the processor is essentially idle during each wait state, it is desirable to minimize the number of wait states required for any given memory access to avoid wasting the computational resources of the computer system.

FIG. 1 is a diagram of the architecture of a prior art page-mode flash memory device 12 that can be accessed with a reduced number of wait states. Flash memory 12 includes a flash memory array 5 containing a plurality of flash memory cells, a sense amplifier circuit 7, a multiplexer 9 and an output buffer 11. Flash memory device 12 receives at least two externally generated signals: an address signal defined by constituent address bits $A_{0-X}$, and an output-enable signal OE#. As shown in FIG. 1, high order address bits $A_{2-X}$ are asserted to address the flash memory array 5, while low order address bits $A_{0-1}$ are asserted to multiplexer 9. High order address bits $A_{2-X}$ define a range of addresses within the flash memory array 5 referred to as a "page address", and the data values stored at respective addresses encompassed by the page address are referred to collectively as a "page of memory", or "page" for short. Flash memory array 5 is designed to output an entire page of memory at once in response to each new page address. The page of memory output by flash memory array 5 is referred to herein as the "pending page", and each constituent data value of the pending page is referred to as a "word". Each word of the pending page is amplified by sense amplifier circuit 7 and asserted at a respective input of multiplexer 9. Low order address bits $A_{0-1}$ act as multiplexer select signals to select one of the words input to multiplexer 9, and multiplexer 9, in response, outputs the selected one of the words to buffer 11. Buffer 11 drives the constituent bits of the selected word onto a data bus upon receiving an active output-enable signal OE# from an external controller.

The most time-consuming access to page-mode flash memory device 12 occurs when the page address is changed from the previous access cycle. In that case, the full access time of the flash memory array is incurred to output a new page of memory. However, if only the lower order, "word select", address bits $A_{0-1}$ are changed from the previous cycle, then the requested data is present in the already pending page of memory and the full flash memory array access time need not be incurred. In effect, the page-mode flash memory device 12 allows the flash memory array access time to be amortized over a number of successive memory read cycles in which the page address remains unchanged. Because retrieval of a full page of memory is frequently required, e.g., to fill a row of cache memory, the page-mode architecture 12 can be used to substantially reduce the average access time for the flash memory device.

FIG. 2 is a timing diagram 35 of a sequence of read operations performed on the prior art page-mode flash memory device of FIG. 1. The signals shown include master clock signal CLK, page address $A_{2-X}$, word select address $A_{0-1}$, chip enable CE#, output enable OE#, and data output $DQ_{0-15}$. As stated above, the page address $A_{2-X}$ and word select address $A_{0-1}$ are each constituents of a single address $A_{0-X}$ asserted by a processor. It will be appreciated that the precise number of bits included in page address $A_{2-X}$ or word select address $A_{0-1}$ may vary between implementations. Grid lines coinciding with each rising edge of the master clock signal CLK are shown to delineate the respective cycle periods of the master clock signal CLK.

During a first cycle period $T_a$ of the master clock signal CLK, a new address, designated Address 0 and including bits $A_{0-X}$, is input to the page-mode flash memory device. Due to bus capacitance, a settling time indicated by arrow 22 is required before page address $A_{2-X}$ and word select address $A_{0-1}$ become valid. Once the page address $A_{2-X}$ becomes valid, address decode logic external to the flash memory device asserts chip enable CE# to enable the page address $A_{2-X}$ into the flash memory device. As indicated by arrow 24 a propagation delay is incurred before the chip enable CE# transitions to an active low potential. Chip enable CE# continues to be asserted at the active low potential so long as page address $A_{2-X}$ remains unchanged.

As indicated by arrow 26, cycles $T_{w1}$, $T_{w2}$, $T_{w3}$ and $T_{w4}$ of the master clock signal CLK are completed before the addressed word, Data 0, becomes valid. Master clock cycles $T_{w1}$, $T_{w2}$, $T_{w3}$ and $T_{w4}$ represent wait states required to allow the flash memory array to be accessed and during these wait states the processor is essentially idle. The output enable signal OE# transitions to an active low potential some time before Data 0 becomes valid to allow Data 0 to be output to a data bus. The processor reads Data 0 during cycle $T_{d0}$ of the master clock signal CLK and then asserts a new address, Address 1, at the rising edge of the subsequent clock cycle, $T_w$.

Assuming that Address 1 includes the same page address as Address 0, the page address asserted to the flash memory device during clock cycle $T_a$ remains valid so that signals chip enable CE# and output enable OE# remain active. Also, by virtue of the page mode architecture described in reference to FIG. 1, the already pending page of memory contains the data value, Data 1, indicated by Address 1. Consequently, the time required for Data 1 to become valid is significantly less than the time required for Data 0 to become valid. More specifically, as indicated by arrow 28, Data 1 becomes valid during the cycle $T_{d1}$ of the master clock signal which immediately follows the clock cycle $T_w$ in which Address 1 was asserted. The consequence of the reduced time for Data 1 to become valid is a reduced read cycle time for Data 1 (two master clock cycles) compared to the read cycle time for Data 0 (six master clock cycles). As indicated by arrows 30 and 32, respectively, additional data values from the pending page of memory, Data 2 and Data 3, are also addressed and output within two master clock cycles each. Consequently, with the page-mode architecture, the total number of clock cycles required for the processor to read four data values from the flash memory device can be reduced from a possible twenty-four clock cycles (4 words×6 clock cycles per word) to twelve clock cycles.

Despite the savings in access time made possible by the page mode architecture, wait states are still required to read data from the flash memory device, even after the page of memory is pending. For example, referring to FIG. 2, each of the $T_w$ cycles of the master clock signal CLK that follow $T_{d0}$, $T_{d1}$, $T_{d2}$ and $T_{d3}$, respectively, represent wait states during which the processor is essentially idle.

BRIEF SUMMARY OF THE INVENTION

A method and apparatus for outputting data stored in a non-volatile memory device is described. The non-volatile memory device receives an address indicating a plurality of data values stored in a non-volatile memory array of the memory device. A select signal is then generated in the non-volatile memory device to select in a predetermined sequence each data value of the indicated plurality of data values. Each selected data value of the plurality of data values is then output according to the predetermined sequence.

BRIEF DESCRIPTION OF THE DRAWING

The present invention is illustrated by way of example and not limitation in the figures of the accompanying drawing in which like references indicate similar elements and in which.

DETAILED DESCRIPTION

A method and apparatus for outputting data from a non-volatile memory device is described. Although the detailed description describes embodiments based on a flash EPROM, the invention may be used in any non-volatile semiconductor memory, including, but not limited to EPROMs, EEPROMs and flash memories, including technologies such as NOR, NAND, AND, Divided bit-line NOR (DINOR) and Ferro-electric random access memory (FRAM).

A non-volatile memory device according to one embodiment of the present invention includes a non-volatile memory array, a sense amplifier circuit, a multiplexer, a data selector, a sequence controller, a latch, an output buffer, an address input and a clock input. An address indicating a plurality of data values stored in the non-volatile memory array is received via the address input. The indicated plurality of data values is amplified by the sense amplifier circuit and input to the multiplexer. The data selector transitions a multiplexer select signal through a sequence of select states with each select state being entered at the falling edge of a clock signal received at the clock input. The sequence of select states is determined by the sequence controller. In response to each select state of the sequence of select states, the multiplexer outputs a respective one of the plurality of data values. At each rising edge of the clock signal which follows a transition to a new select state, the data value output by the multiplexer is latched in an output latch. The data value latched in the output latch is asserted to the output buffer which drives the data value onto a data bus. Because the output latch allows the data selector to transition the multiplexer select signal to select the next output data value without disturbing the present output data value, and because of the short settling time required for the data-selector-generated multiplexer select signal, the present invention enables a sequence of data values to be output from the non-volatile memory device without requiring intervening wait-states.

Figure 1:
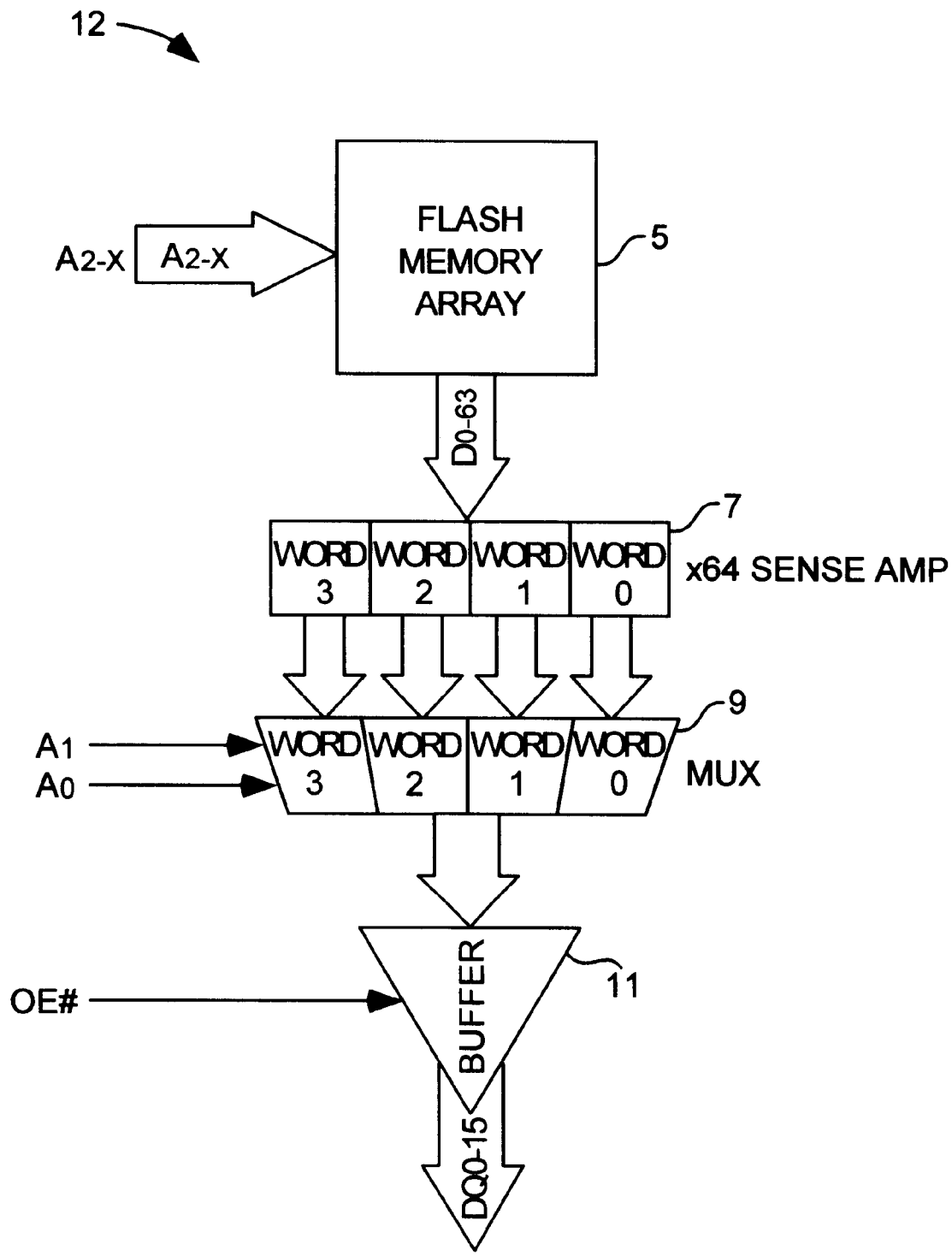
FIG. 1 is a diagram of a prior-art page-mode flash memory architecture.
Figure 3:
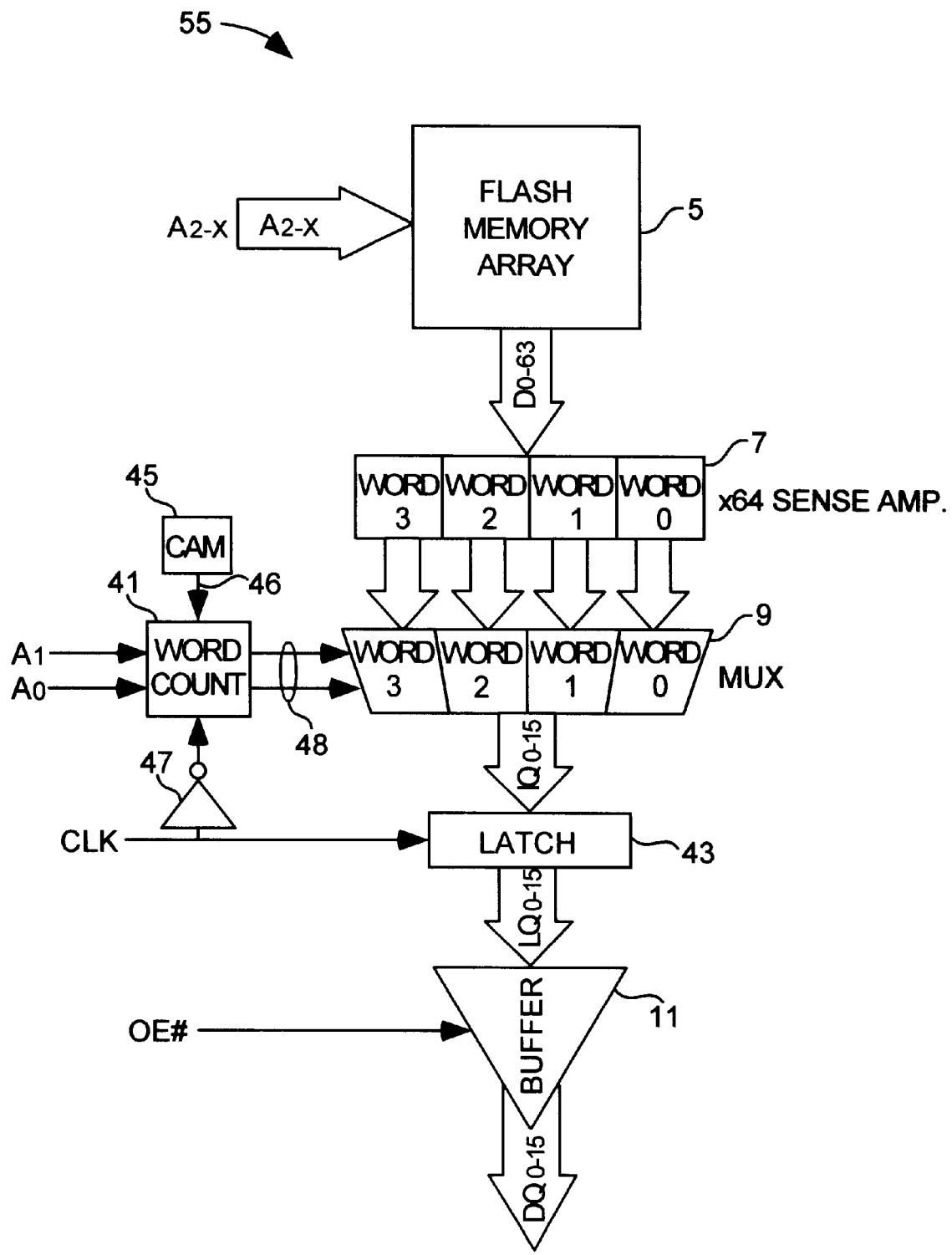
FIG. 3 is a diagram of a page-mode flash memory architecture according to one embodiment of the present invention.

FIG. 3 is a diagram of a synchronous page-mode flash memory device 55 that implements one embodiment of the present invention. Flash memory device 55 includes a flash memory array 5, sense amplifier circuit 7, multiplexer 9 and output buffer 11, each having the function described above in reference to FIG. 1. Flash memory device 55 further includes a data selector 41, a latch 43 and a sequence controller 45. Flash memory device 55 receives at least three externally generated signals: an address signal defined by constituent address bits $A_{0-X}$, an output-enable signal OE# and a master clock signal CLK.

Data selector 41 serves as an internal address generator to supply a sequence of word select addresses to the multiplexer 9. Each word select address is a multiplexer select signal composed of a sufficient number of bits to select any one word in a page of memory pending at the input of multiplexer 9. The state of the constituent bits of the multiplexer select signal at any given time is referred to as a "select state".

Data selector 41 receives the master clock signal CLK through inverter 47 and asserts each word select address of the sequence of word select addresses in response to a respective transition of the master clock signal CLK. Because the signal path 48 between data selector 41 and multiplexer 9 is short, capacitance in the signal path is minimal. Consequently, the settling time required for each word select address asserted by data selector 41 is significantly less than the settling time of the low order address bits $A_{0-1}$ relied upon by prior-art devices.

The purpose of inverter 47, which can be considered to be part of data selector 41, is to cause the data selector 41 to assert a new word select address at each successive falling edge of the master clock signal CLK after an initial word address becomes valid. By clocking the data selector on the falling edge of master clock signal CLK, the time at which each word select address generated by data selector 41 becomes valid is advanced by one-half cycle of the master clock signal CLK. As discussed below in reference to FIG. 4, the combination of advancing the assertion of the word select address by a half clock cycle and reducing the settling time of the word select address makes it possible to present a new valid word select address on successive clock cycles of the master clock signal CLK. A processor can then read the sequence of words selected by the sequence of word select addresses without intervening wait states.

One consequence of clocking the data selector 41 on the falling edge of the master clock signal CLK is that the advanced assertion of each word select address makes it possible for the multiplexer to output the newly selected word before the previously output word has been read by the processor. This consequence is avoided in one embodiment of the present invention by providing latch 43 to prevent disturbance of the data output while it is being read by the processor. Latch 43 is interposed between multiplexer 9 and output buffer 11 and receives the master clock signal CLK.

Latch 43 latches each data word output by multiplexer 9 on a respective rising edge of the master clock signal CLK; one-half cycle of the master clock signal CLK after the word was selected by data selector 41. The output of latch 43 is asserted to the input of buffer 11 which then drives the latched data onto the data bus. Thus, even if the output of multiplexer 9 changes before the previously output data value has been read by the processor, the value asserted by latch 43 and therefore by output buffer 11 remains unchanged at least until the next rising edge of the master clock signal CLK.

It will be appreciated that using data selector 41 to generate a sequence of word select addresses without waiting to receive the corresponding sequence of processor-asserted addresses requires the sequence of processor asserted addresses to be anticipated. Moreover, because different processors access memory according to different data ordering schemes, designing flash memory device 55 to anticipate any particular sequence of word select addresses would significantly limit the market for the device. In one embodiment of the present invention, sequence controller 45 is provided to address this issue.

Generally, a given processor will read a page of data according to a predetermined sequence known as a burst order. For example, processors made by Intel™ corporation typically read words of a four-word page in the sequence 1-0-3-2, known as a "Intel burst order". Each number in the sequence represents the offset of the word within the page. Other processors read words of a four-word page in the sequence 1-2-3-0, known as a "linear burst order". In one embodiment of the present invention, sequence controller 45 is provided to assert one or more control signals 46 to the data selector 41 indicating that the data selector 41 is to generate word select addresses according to one of a plurality of predetermined sequences. For example, in one state, the one or more control signals 46 could indicate the Intel burst order and in another state the one or more control signals 46 could indicate the linear burst order, and so forth. The state of the one or more control signals 46 asserted by the sequence controller 45 may be hard-wired during device fabrication, or, alternatively, a programmatic interface such as a control register may be included within the flash memory device to allow the state of the one or more control signals 46 asserted by sequence controller 45 to be set by a processor under program control.

In addition to receiving the master clock signal CLK and the one or more control signals 46 output by the sequence controller 45, data selector 41 receives the low order bits of the processor-asserted address $A_{0-1}$. In one embodiment of the present invention, data selector 41 generates the first word select address in the sequence of word select addresses based on the state of the low order address bits $A_{0-1}$. If the initial word select address indicated by low-order address bits $A_{0-1}$ is not the same as the initial word in the indicated burst order, then data selector 41 generates the sequence of word select addresses according to the burst order indicated by sequence controller 45, but starting at the word offset indicated by low-order address bits $A_{0-1}$. After the last word select address in the burst order has been asserted, the next word select address is wrapped to the beginning of the burst order. For example, if sequence controller indicates that burst order 1-0-3-2 is to be followed, but the starting word-select address indicated by low-order address bits $A_{0-1}$ is 0, then the sequence of word select addresses asserted by data selector 41 would be 0-3-2-1.

As with the burst order sequence, data selector 41 may be hard-wired during fabrication to either ignore low-order address bits $A_{0-1}$ or to use low-order address bits $A_{0-1}$ to determine a starting word select address within a burst sequence. Alternatively, sequence controller 45 may include a programmatic interface that allows a programmed processor to set the operating mode of the data selector 41 to either reference or ignore the low-order address bits in determining the starting word select address of a burst sequence. The programmed operating mode could then be communicated to the data selector 41 by the state of one or more additional bits included in the one or more control signals 46.

In another embodiment of the present invention, the sequence selector 45 includes a programmatic interface that allows the flash memory device 55 to be operated in an asynchronous mode. When flash memory device 55 is configured for asynchronous mode operation, data selector 41 is placed in a pass-through mode so that low-order address bits $A_{0-1}$ are passed directly through to multiplexer 9 to select the output thereof. Also, latch 43 is placed in a transparent state so that the output of multiplexer 9 is passed directly to buffer 11. Thus, a programmed processor may configure the flash memory device to be operated in synchronous mode or in asynchronous mode by writing a control value to the sequence selector 45 which, in response, asserts the signals necessary to control the operation of latch 43 and data selector 41. Further, in the synchronous operating mode, sequence controller 45 may signal the data selector 41 to assert successive word select addresses according to one of a plurality of predetermined word select sequences, either referencing or ignoring the starting word select address indicated by the low-order address bits of a processor-asserted address.

Figure 4:
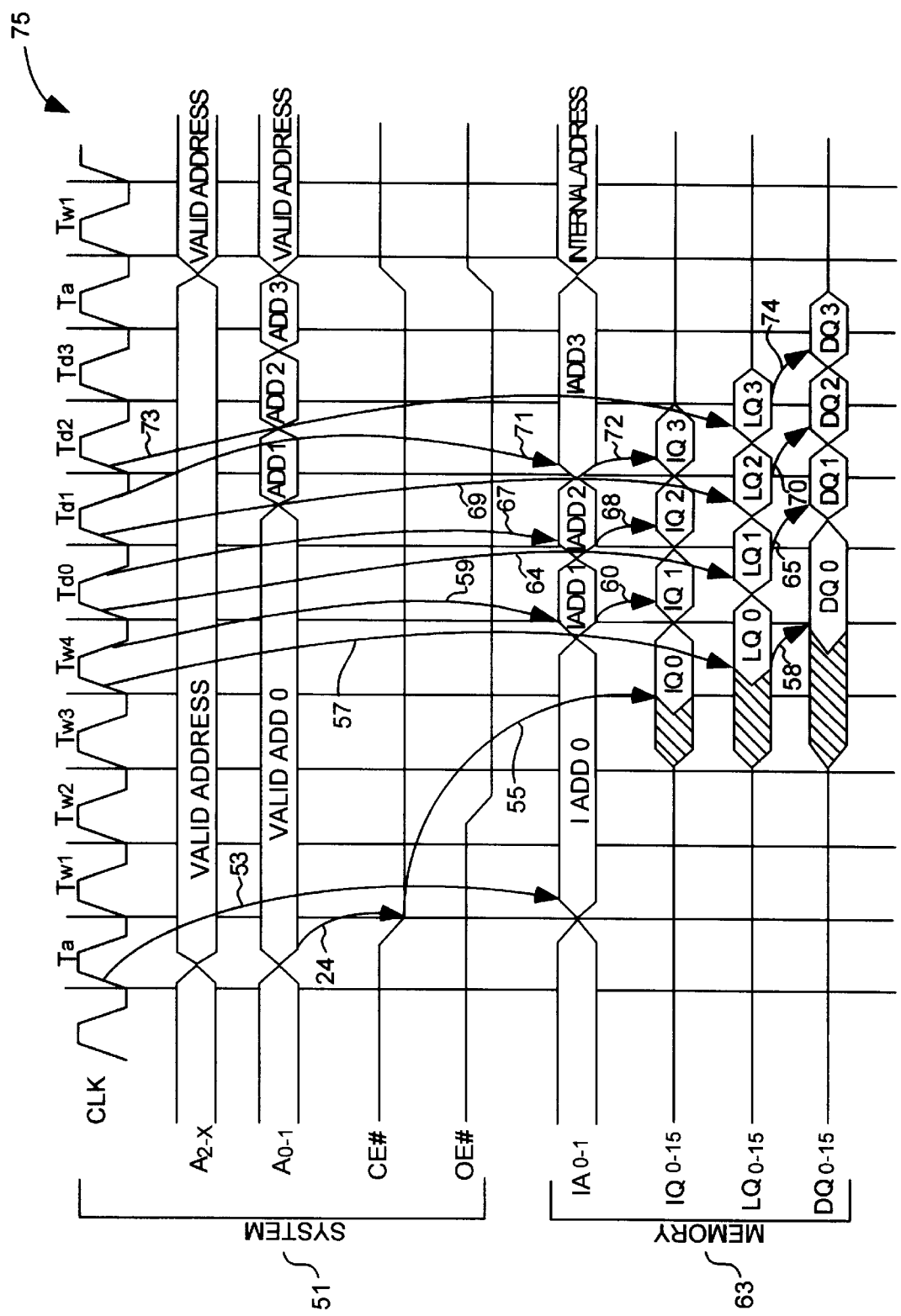
FIG. 4 is a timing diagram illustrating a sequence of read operations performed using the memory architecture of FIG. 3.

FIG. 4 is a timing diagram 75 of a sequence of read operations performed on the synchronous page-mode flash memory device of FIG. 3. The signals depicted in diagram 75 have been divided into two groups: a group of system signals 51 and a group of memory signals 63. The group of system signals 51 includes signals received in the flash memory device, but generated by one or more devices external to the flash memory device. The group of system signals 51 includes master clock signal CLK, page address $A_{2-X}$, word select address $A_{0-1}$, chip enable CE#, and output enable OE#. Each of these signals serves the purpose discussed above in reference to FIG. 2. The group of memory signals 63 includes the signals generated by components of the flash memory device itself, namely, internal address $IA_{0-1}$, multiplexer output $IQ_{0-15}$, latch output $LQ_{0-15}$ and data output $DQ_{0-15}$. Grid lines coinciding with each rising edge of the master clock signal CLK are shown to delineate the respective cycle periods of the master clock signal CLK.

During a first cycle period $T_a$ of the master clock signal CLK, a processor asserts an address to the flash memory device. This first address is designated Add0 in FIG. 4 and includes page address $A_{2-X}$ and word select address $A_{0-1}$. As discussed above in reference to FIG. 2, a settling time is required before page address $A_{2-X}$ and word select address $A_{0-1}$ become valid. Once the page address $A_{2-X}$ becomes valid, address decode logic external to the flash memory device asserts chip enable CE# to enable the page address $A_{2-X}$ into the flash memory device. As indicated by arrow 24, a propagation delay is incurred before the chip enable CE# transitions to an active low potential. The output enable signal OE# transitions to an active low potential some time before the addressed data value DQ0 becomes valid to allow DQ0 to be output to a data bus. Both chip enable CE# and output enable OE# remain active until page address $A_{2-X}$ is changed.

Figure 2:
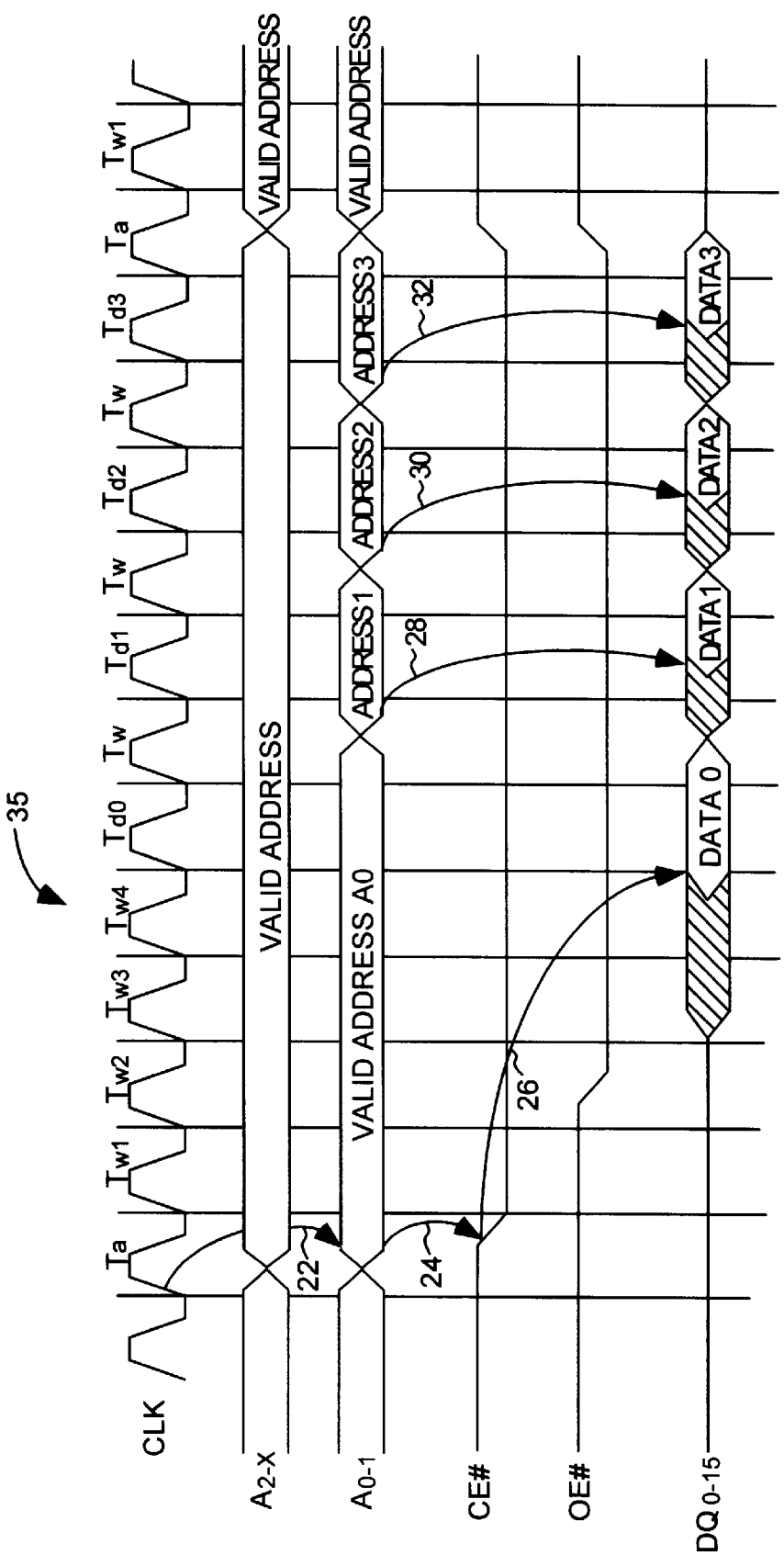
FIG. 2 is a timing diagram illustrating a sequence of read operations performed using the prior-art memory architecture of FIG. 1.

Up to this point, events described in timing diagram 75 of FIG. 4 have been as described in reference to timing diagram 35 of FIG. 2. In response to the falling edge of the master clock signal during cycle period $T_a$, however, a data selector as described in reference to FIG. 3 generates an internal word select address IAdd0. This is indicated in diagram 75 by arrow 53. As stated above, this initial internal word select address may or may not be based on the state of the processor-asserted word select address $A_{0-1}$, depending on the configuration of the flash memory device.

Because the first access after a new page address $A_{2-x}$ is asserted incurs the full access time of the flash memory array, a number of clock cycles $T_{w1}, T_{w2}, T_{w3}$ pass before the addressed page becomes pending at the input of the multiplexer. Then, shortly before the master clock signal CLK transitions to clock cycle $T_{w4}$, the word IQ0 selected by internal word select address IAddO is output by the multiplexer. Arrow 55 indicates the delay between the assertion of chip enable CE# and the time at which the initial multiplexer output word IQ0 becomes valid.

At the rising edge of cycle $T_{w4}$ of the master clock signal CLK, word IQ0 is latched by a latch as described in reference to FIG. 3. As indicated by arrow 57, there is a propagation delay between the rising edge of cycle $T_{w4}$ and the time the latched word LQ0 becomes valid. The latched word LQ0 is asserted to an output buffer which drives a system data bus with DQ0. Arrow 58 indicates the propagation delay required to output DQ0. Thus, DQ0 is made available to the processor during cycle $T_{d0}$ of the master clock signal CLK, after clock cycles $T_{w1}, T_{w2}, T_{w3}$ and $T_{w4}$ have completed.

As indicated by arrow 59, at the falling edge of clock cycle $T_{w4}$, a new internal word select address IAdd1 is generated. IAdd1 enables word IQ1 to be output by the multiplexer a short time later, as indicated by arrow 60. IQ1 is latched at the rising edge of $T_{d0}$, as indicated by arrow 64, to produce latched output LQ1. LQ1, in turn, is used to drive DQ1 onto the data bus a short time later, as indicated by arrow 65. Thus, by asserting internal word select address IAdd1 in response to the falling edge of clock cycle $T_{w4}$ during which time the previous data word LQ0 was latched, and by virtue of the short settling time required for the internal word select address IAdd1, it is possible to assert a new valid word select address IQ1 during the clock cycle $T_{d1}$ which immediately follows the clock cycle $T_{w4}$ during which the previous internal address IQ0 was asserted. As a result, IQ1 becomes valid in time for LQ1 to be latched at the rising edge of clock cycle $T_{d0}$; one clock cycle after LQ0 was latched. Similarly, DQ1 is output during clock cycle $T_{d1}$, one clock cycle after DQ0 was output.

As indicated by arrow 67, internal word select address IAdd2 is asserted in response to the falling edge of clock cycle $T_{d0}$, one clock cycle after word select address IAdd1. As with the advanced assertion of IAdd1, and as indicated by arrows, 68, 69 and 70, the advanced assertion of LAdd2 makes it possible for IQ2, LQ2 and DQ2 to be asserted during cycles of the master clock signal that immediately succeed the respective cycles of the master clock in which IQ1, LQ1 and DQ1 have been asserted. Likewise, the assertion of IAdd3 in response to the falling edge of clock cycle $T_{d1}$ enable IQ3, LQ3 and DQ3 to be asserted during cycles of the master clock signal that immediately succeed the respective cycles of the master clock in which IQ2, LQ2 and DQ2 have been asserted. Arrows 71, 72, 73 and 74 indicate the times at which IAdd3, IQ3, LQ3 and DQ3, respectively, are asserted.

Still referring to FIG. 4, it will be appreciated that the internal word select address, multiplexer output, latch output and buffer output are asserted in a pipelined fashion, with the latency between an internal address assertion and the corresponding buffer output being greater than a cycle of the master clock signal CLK. Consequently, during the time buffer output DQ0, for example, is being driven onto a data bus, the multiplexer is already asserting the subsequently selected word IQ1. Thus, it becomes possible for IQ1 to propagate through to the device output before DQ0 is read, rendering the device output unstable. However, by latching IQ0 in an output latch on the rising edge of clock cycle $T_{d0}$, DQ0 is asserted and maintained undisturbed for a full clock cycle.

Referring to the processor asserted word select signal $A_{0-1}$, address Add1 is asserted by the processor in the clock cycle $T_{d1}$, which immediately follows the clock cycle $T_{d0}$ in which DQ0 was read. Despite the fact that address Add1 may not have settled by the end of clock cycle $T_{d1}$, the processor is still able to read the addressed word by virtue of the advanced internal address generation of the synchronous page-mode flash memory device. Likewise, processor-asserted word select addresses Add2 and Add3 may not settle by the end of clock cycles $T_{d2}$ and $T_{d3}$, respectively, but this does not prevent the processor from reading DQ2 and DQ3 in those clock cycles. Thus, after waiting a number of wait states for initial word DQ0 to become available, the processor is permitted to read words DQ1, DQ2 and DQ3 in successive cycles of the master clock signal CLK, thereby eliminating wait states required in prior art devices.

Figure 5:
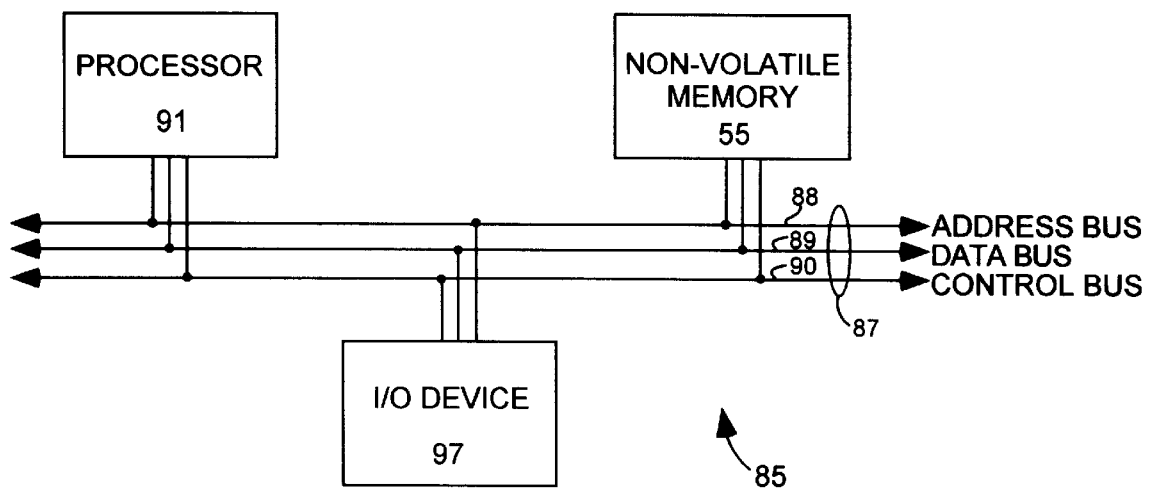
FIG. 5 is a block diagram of a computer system including a non-volatile memory, the non-volatile memory being in accordance with one embodiment of the present invention.

FIG. 5 is a block diagram of an apparatus 85 including the synchronous page-mode non-volatile memory device 55 described above, processor 91 and I/O device 97 each coupled to bus 87. Apparatus 85 may be a computer system, camera, telephone, data recording instrument, or any other device in which processor-accessible non-volatile storage is required. In the case of a computer system, processor 91 may be a microprocessor and I/O device 97 may include a keyboard, mouse or other cursor control device, mass storage device, core memory, and display. In the case of a telephone, processor 91 may be a microcontroller and I/O device 97 may include a keypad, speaker, microphone, and signal generation and reception circuitry. Other devices may similarly include additional components coupled to bus 87.

As shown in FIG. 5, bus 87 includes an address bus 88, data bus 89 and control bus 90. In one embodiment of the present invention, control bus 90 includes a conductor for receiving a master clock signal asserted by processor 91. Synchronous page-mode non-volatile memory 55 can be driven by this clock signal. Also, while non-volatile memory 55 is depicted as being connected directly to bus 87, a memory controller including address decode logic and logic for asserting an output enable and chip enable signal to the non-volatile memory 55 may also be provided.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly to be regarded in an illustrative rather than a restrictive sense.

What is claimed is:

1. A method for outputting data stored in a non-volatile memory device, said method comprising the steps of:

receiving an address indicating a plurality of data values stored in a non-volatile memory array of the memory device;

generating in the non-volatile memory device a select signal to select in a predetermined sequence each data value of the plurality of data values; and outputting according to the predetermined sequence each selected data value of the plurality of data values.

2. The method of claim 1 wherein said step of receiving an address indicating a plurality of data values comprises the step of receiving an address including high order bits and low order bits, the high order bits indicating a range of storage locations containing the plurality of data values.

3. The method of claim 1 wherein said step of generating comprises the step of transitioning the select signal through a sequence of select states, each select state of the sequence of select states indicating a respective data value of the plurality of data values.

4. The method of claim 3 wherein said step of transitioning the select signal through a sequence of select states comprises the step of determining a first select state of the sequence of select states based on the address indicating the plurality of data values.

5. The method of claim 3 further comprising the step of receiving a clock signal in the non-volatile memory device and wherein said step of transitioning the select signal through a sequence of select states comprises the step of transitioning the select signal to each select state of the sequence of select states in response to a respective transition of the clock signal.

6. The method of claim 1 further comprising the step of receiving a clock signal in the non-volatile memory device and wherein said step of outputting comprises the step of latching each selected data value in an output latch in response to a respective transition of the clock signal having a first direction.

7. The method of claim 6 wherein said step of generating comprises the step of transitioning the select signal through a sequence of select states at respective transitions of the clock signal having a second direction.

8. The method of claim 7 wherein the respective transition of the clock signal having a first direction is a rising edge of the clock signal and wherein each respective transition of the clock signal having a second direction is a falling edge of the clock signal.

9. The method of claim 1 further comprising the step of determining based on a sequence control signal the predetermined sequence in which each data value of the plurality of data values is selected.

10. The method of claim 9 wherein said step of determining based on a sequence control signal comprises the steps of:

selecting each data value of the plurality of data values according to a first predetermined sequence if the sequence control signal is in a first state; and selecting each data value of the plurality of data values according to a second predetermined sequence if the sequence control signal is in a second state.

11. A method for outputting data stored in a non-volatile memory, said method comprising the steps of:

receiving in the non-volatile memory an address indicating a plurality of data values stored in the non-volatile memory;

asserting the plurality of data values at an input of a multiplexer; and generating in the non-volatile memory a sequence of multiplexer select signals, each multiplexer select signal of the sequence of multiplexer select signals being asserted in response to a respective transition of a clock signal to cause the multiplexer to output a respective data value of the plurality of data values.

12. The method of claim 11 further comprising the step of latching each data value output by the multiplexer in an output latch in response to the respective transition of the clock signal.

13. The method of claim 12 wherein said step of generating comprises the step of generating a sequence of multiplexer select signals in response to respective transitions of the clock signal having a first transition direction and wherein said step of latching comprises the step of latching each data value output by the multiplexer in the output latch in response to the respective transition of the clock signal having a second transition direction.

14. The method of claim 13 wherein the first transition direction is a falling edge of the clock signal and wherein the second transition direction is a rising edge of the clock signal.

15. The method of claim 11 wherein said step of asserting the plurality of data values at an input of a multiplexer comprises the step of asserting a plurality of bits at the input of the multiplexer, each N bits of the plurality of bits representing one of the plurality of data values, N being one or greater.

16. The method of claim 11 wherein said step of generating comprises the steps of:

determining the state of a sequence control signal;

generating the sequence of multiplexer select signals according to a first data output sequence if the sequence control signal is in a first state; and generating the sequence of multiplexer select signals according to a second data output sequence if the sequence control signal is in a second state.

17. A memory device comprising:

a non-volatile memory array;

an address input coupled to the non-volatile memory array, to receive an address indicating a plurality of data values stored in said non-volatile memory array;

a multiplexer coupled to receive the indicated plurality of data values;

a clock input to receive a clock signal; and a data selector coupled to the clock input and to the multiplexer, to generate a sequence of select signals, each select signal of the sequence of select signals being asserted in response to a respective transition of the clock signal to enable said multiplexer to output a respective one of the plurality of data values.

18. The memory device of claim 17 further comprising an output latch to latch the respective one of the plurality of data values.

19. The memory device of claim 18 wherein said output latch latches the respective one of the plurality of data values in response to a transition of the clock signal having a first transition direction and wherein the respective transition of the clock signal to enable said multiplexer has a second transition direction, the second transition direction being different from the first transition direction.

20. The memory device of claim 19 wherein the transition of the clock signal having a first transition direction is a rising edge of the clock signal.

21. The memory device of claim 17 wherein the sequence of select signals includes a starting select signal determined based on one or more least significant bits of the address.

22. The memory device of claim 17 further comprising a sequence controller to assert a control signal to said data selector, the control signal indicating one of a plurality of sequences of select signals to be generated by said data selector.

23. A memory device comprising:

means for non-volatile storage of data;

means for receiving an address indicating a plurality of data values stored in said means for non-volatile storage;

means for receiving a clock signal;

means for generating a sequence of select signals responsive to respective transitions of the clock signal; and means for outputting a respective one of the plurality of data values in response to each select signal of the sequence of select signals.

24. The memory device of claim 23 further comprising means for asserting a control signal to said means for generating, the control signal indicating one of a plurality of sequences of select signals to be generated by said means for generating.

25. The memory device of claim 23 wherein said means for outputting comprises means for latching the respective one of the plurality of data values in response to a transition of the clock signal.

26. An apparatus comprising:

a clock source;

a bus including a plurality of address conductors;

a processor coupled to said bus; and a memory device coupled to said bus, said memory device including:

a non-volatile memory array;

an address input coupled to the plurality of address conductors to receive from said processor an address indicating a location of a plurality of data values stored in said non-volatile memory array;

a multiplexer coupled to said non-volatile memory array, to receive the indicated plurality of data values;

a clock input coupled to receive a clock signal based on an output of said clock source; and a data selector coupled to said multiplexer and said clock input, to generate a sequence of select signals, each select signal of the sequence of select signals being asserted in response to a respective transition of the clock signal to enable said multiplexer to output a respective one of the plurality of data values.

27. The apparatus of claim 26 wherein said bus further includes a plurality of data conductors and wherein said memory device further includes an output latch to receive and latch the respective one of the plurality of data values from said multiplexer, said latch asserting the respective one of the plurality of data values at an output coupled to the plurality of data conductors.

* * * * *

UNITED STATES PATENT AND TRADEMARK OFFICE
CERTIFICATE OF CORRECTION

PATENT NO.    : 5,903,496                                    Page 1 of 1
DATED         : May 11, 1999
INVENTOR(S)   : Kendall et al.

It is certified that error appears in the above-identified patent and that said Letters Patent is hereby corrected as shown below:

Column 6,
Line 53, delete "AddO" and insert -- Add0 --.

Column 7,
Line 16, delete "IAddO" and insert -- IAdd0 --.
Line 54, delete "LAdd2" and insert -- IAdd2 --.

Signed and Sealed this

Twenty-fifth Day of November, 2003

JAMES E. ROGAN
*Director of the United States Patent and Trademark Office*